United States Patent
Naffziger (12)

(10) Patent No.: US 6,292,041 B1
(45) Date of Patent: Sep. 18, 2001

(54) CIRCUIT AND METHOD FOR LIMITING SUBTHRESHOLD LEAKAGE

(75) Inventor: Samuel D Naffziger, Ft Collins, CO (US)

(73) Assignee: Hewlett Packard Company, Palo Alto, CA (US)

( * ) Notice: Subject to any disclaimer, the term of this patent is extended or adjusted under 35 U.S.C. 154(b) by 0 days.

(21) Appl. No.: 09/504,642

(22) Filed: Feb. 16, 2000

(51) Int. Cl.[7] .................................................. H03K 3/017
(52) U.S. Cl. .............................. 327/172; 327/172; 377/68
(58) Field of Search .................................... 327/172, 173, 327/175, 176, 112; 377/57, 58, 60, 63, 64, 68, 70, 71, 73, 74, 77, 78, 79, 80, 81

(56) References Cited

U.S. PATENT DOCUMENTS

| | | | |
|---|---|---|---|
| 4,688,018 | * | 8/1987 | Vaughn ................................ 340/347 |
| 4,797,585 | * | 1/1989 | Segawa et al. ...................... 307/594 |
| 5,202,908 | * | 4/1993 | Hatada .................................. 377/64 |
| 5,619,157 | * | 4/1997 | Kumata et al. ...................... 327/203 |
| 5,859,999 | | 1/1999 | Morris et al. ........................ 395/565 |
| 5,860,017 | | 1/1999 | Sharangpani et al. .......... 395/800.23 |

OTHER PUBLICATIONS

Wolfe, A., "Patents shed light on Merced's Innards", Electronic Engineering Times, Feb. 15, 1999.

* cited by examiner

Primary Examiner—Jeffrey Zweizig

(57) ABSTRACT

Disclosed are circuits and methods that prevent failure modes in related circuits. The circuit processes a pulse for use with a related circuit. The circuit comprises a timer and one or more logic gates. The timer produces an output in a given state if the duration of the pulse reaches a predetermined amount of time. The predetermined amount of time is related to a parameter of the related circuit. The one or more logic gates have an output that is the same as the pulse unless and until the output of the timer is in the given state, at which time, the output of the one or more logic gates is forced to a non-pulsed state. Preferably, the parameter is a subthreshold leakage rate across an FET. The method is used with a circuit in which leakage can occur at a first rate. The method comprises the step of sensing a condition that prompts leakage to occur in the circuit. In response to the sensing step, the method produces a related leakage at a faster rate than the first rate. The method disables the condition if the related leakage reaches a predetermined level. Preferably, the condition is a pulse.

20 Claims, 5 Drawing Sheets

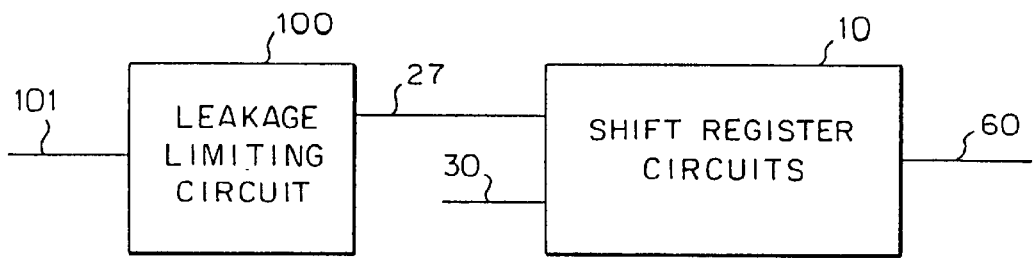
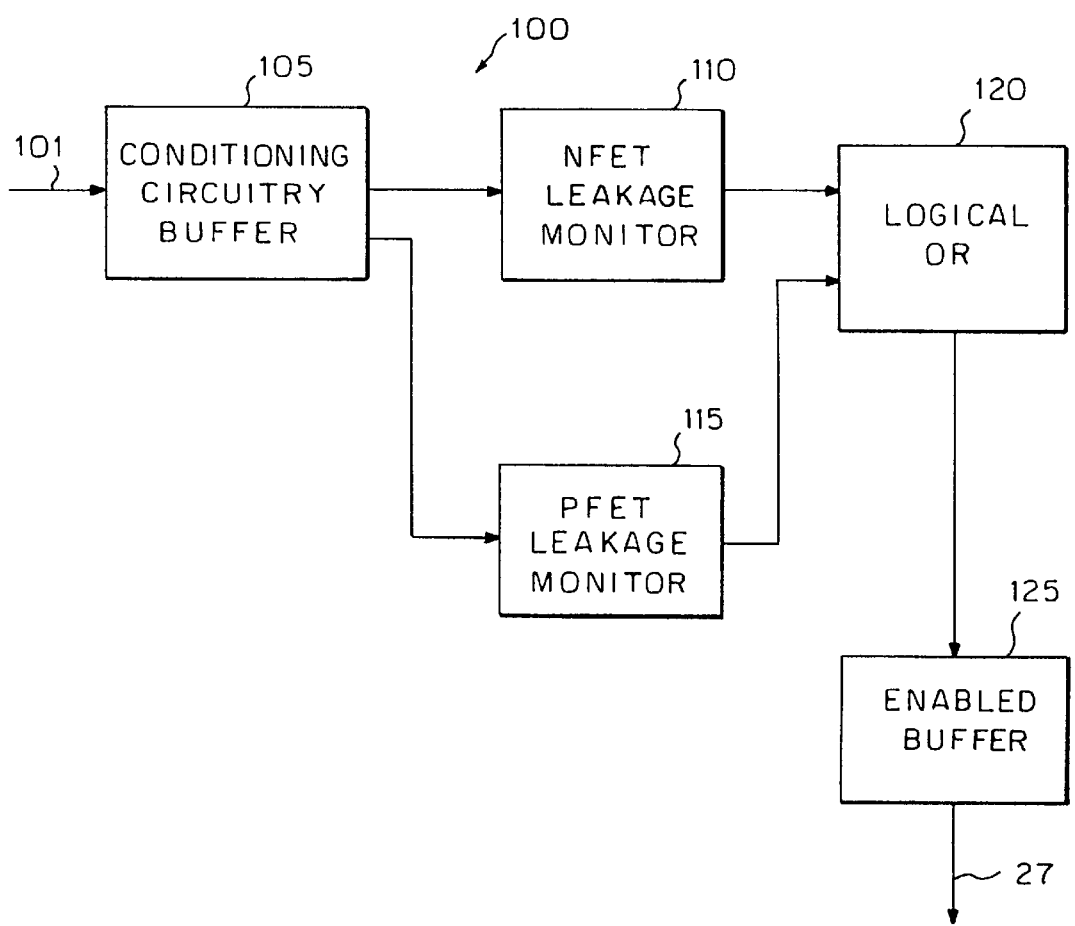

CIRCUIT AND METHOD FOR LIMITING SUBTHRESHOLD LEAKAGE

TECHNICAL FIELD

The invention relates to digital pulse generators. More particularly, the invention relates to methods and apparatus for tracking subthreshold leakage during an active period and generating digital pulses to avoid deleterious effects of subthreshold leakage.

BACKGROUND ART

In certain applications, it is desirable to limit the amount of time a signal is active in CMOS (complementary metal oxide semiconductor) circuits to protect the circuits against various circuit failure modes. One example of a circuit failure mode is a dynamic decay due to subthreshold leakage. A shift register circuit 10 is shown in FIG. 1 for the purpose of illustrating the deleterious effects of subthreshold leakage. The shift register circuit 10 is shown with only three stages for ease of understanding. Each stage comprises a pass gate 15, a dynamic storage node 35, 45 or 55 and an inverter formed by a PFET (P-channel field effect transistor) 20 and an NFET (N-channel field effect transistor) 25. A shift signal 27 and its inverse, formed by an inverter 28, are connected to each pass gate 15. The pass gates 15 store the logic values at the dynamic storage nodes 35, 45, and 55, which are buffered through the inverters to nodes 30, 40 and 50. When the shift signal 27 is high, the FETs (field effect transistors) forming the dynamic latch 15 "turn on," and, as a result, the logic values at the nodes 30, 40 and 50 pass to nodes 35, 45 and 55, respectively. In this way, the logic states stored by the dynamic latches 15 are shifted right each time the shift input signal 27 pulses high. However, when the shift signal 27 is high, subthreshold leakage occurs through the FETs forming the dynamic latches 15. As used herein, subthreshold leakage is gate current when an FET is conducting. A PFET conducts from source to drain or "turns on" when its gate voltage is low with respect to its source; whereas an NFET turns on when its gate voltage is high with respect to its source. If the shift signal 27 remains high long enough, the subthreshold leakage can be severe enough to cause the latched charge to dissipate. To protect the dynamic latches 15 from failure due to subthreshold leakage requires careful control of the timing of the shift signal 27. However, given the magnitude of variations present in CMOS circuit manufacturing, a one-size-fits-all solution is not practical.

SUMMARY OF INVENTION

In one respect, the invention is a circuit for processing a pulse for use with a related circuit. The circuit comprises a timer and one or more logic gates. The timer produces an output in a given state if the duration of the pulse reaches a predetermined amount of time. The predetermined amount of time is related to a parameter of the related circuit. The one or more logic gates have an output that is the same as the pulse unless and until the output of the timer is in the given state, at which time, the output of the one or more logic gates is forced to a non-pulsed state. Preferably, the parameter is a subthreshold leakage rate across an FET.

In another respect, the invention is a method for use with a circuit, such as a shift register, in which leakage can occur at a first rate. The method comprises the step of sensing a condition that prompts leakage to occur in the circuit. In response to the sensing step, the method produces a related leakage at a faster rate than the first rate. The method disables the condition if the related leakage reaches a predetermined level. Preferably, the condition is a pulse.

In yet another respect, the invention is a circuit in which leakage can occur at a first rate. The circuit comprises a means for sensing a condition that prompts leakage to occur in the circuit; a means for producing, in response to the sensing step, a related leakage at a faster rate than the first rate; and a means for disabling the condition if the related leakage reaches a predetermined level.

Certain embodiments of the invention are also capable of realizing the following advantages:

(1) Protecting circuits that use an output signal from failures produced by subthreshold leakage. For example, the dynamic latches in the shift register circuit 10 can be protected by limiting the duration of pulses on the shift signal 27.

(2) The protection can be self-adapting to the protected circuits, so that an adequate amount of limitation is provided regardless of variations in the manufacturing process.

That is, the protection can track process parameters across manufacturing variations, track the behavior of the circuit being protected (i.e. can use a replica of the circuit prone to failure as the monitor), and allow robust use of circuit types that would otherwise fail due to CMOS manufacturing variations and non-ideal device characteristics.

Those skilled in the art will appreciate these and other advantages and benefits of various embodiments of the invention upon reading the following detailed description of a preferred embodiment with reference to the below-listed drawings.

BRIEF DESCRIPTION OF DRAWINGS

FIG. 2 illustrates the shift register circuit of FIG. 1 along with an embodiment of the invention for tracking FET subthreshold leakage;

FIG. 3 is a high level block diagram of an embodiment of the invention for tracking FET subthreshold leakage;

DETAILED DESCRIPTION OF A PREFERRED EMBODIMENT

Figure 1:
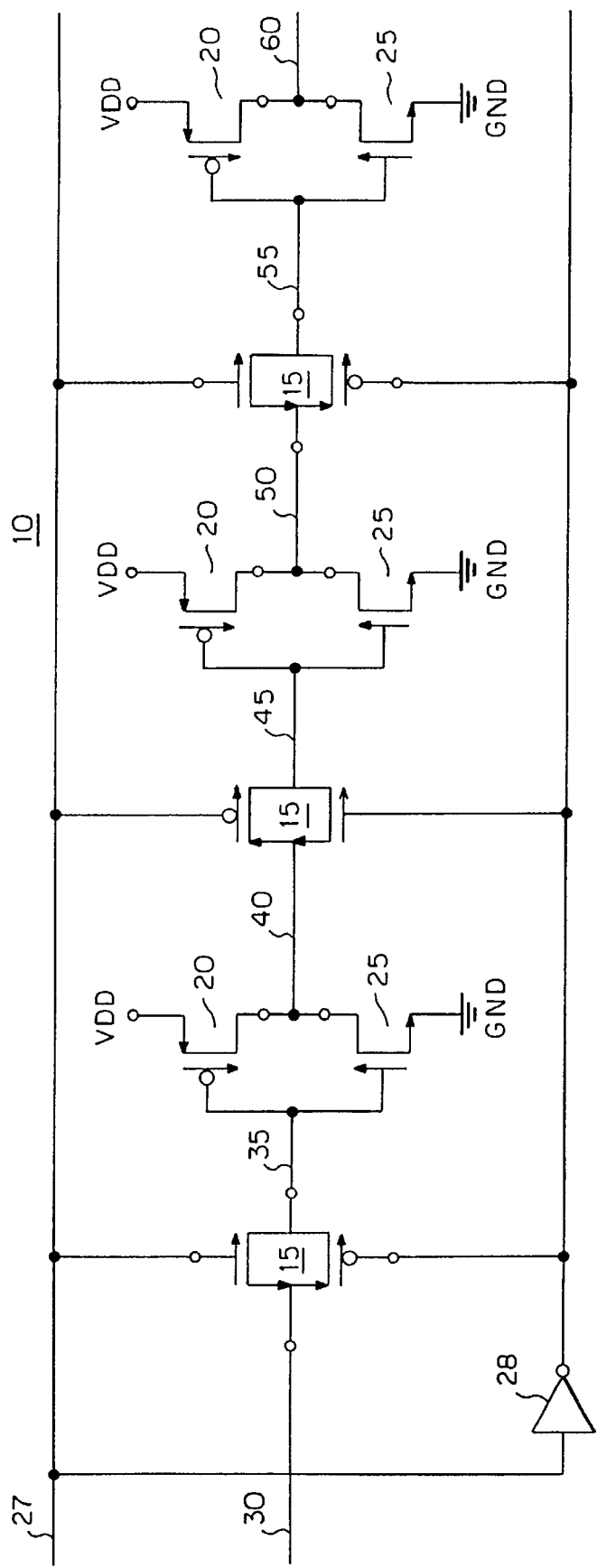
FIG. 1 illustrates a shift register circuit with dynamic latches.

FIG. 2 illustrates an embodiment of the present invention in the context of surrounding circuits. In particular, FIG. 2 illustrates a leakage limiting circuit 100 connected to the shift register circuit 10. An input to the leakage limiting circuit 100 is an input shift signal 101. The output of the leakage limiting circuit 100 is the shift signal 27, which is an input to the shift register circuit 10. Broadly speaking, the leakage limiting circuit 100 processes the input shift signal 101 such that shift pulses propagating through to the shift signal 27 have a duration that is controlled, limited, abbreviated, truncated or shortened, so as to avoid subthreshold leakage in the shift register circuit 10. One skilled in the art will readily recognize that the shift register circuit 10 is exemplary of a broad class of circuits to which the leakage limiting circuit 100 can be put to good use. For example, any circuit having one or more dynamic storage nodes or pass gates would benefit from the leakage limiting circuit 100.

FIG. 3 is a high level block diagram of the leakage limiting circuit 100. An input shift signal 101 is input into the leakage limiting circuit 100 through a condition and buffer component 105. The condition and buffer component 105 sends the input shift signal 101 to an NFET leakage monitor 110 and to a PFET leakage monitor 115 to simultaneously monitor both NFET leakage and PFET leakage. The outputs of both the NFET leakage monitor 110 and the PFET leakage monitor 115 are sent to a logical OR gate 120, whose output is sent to an enabled buffer 125, which outputs the shift signal 27.

Figure 4:
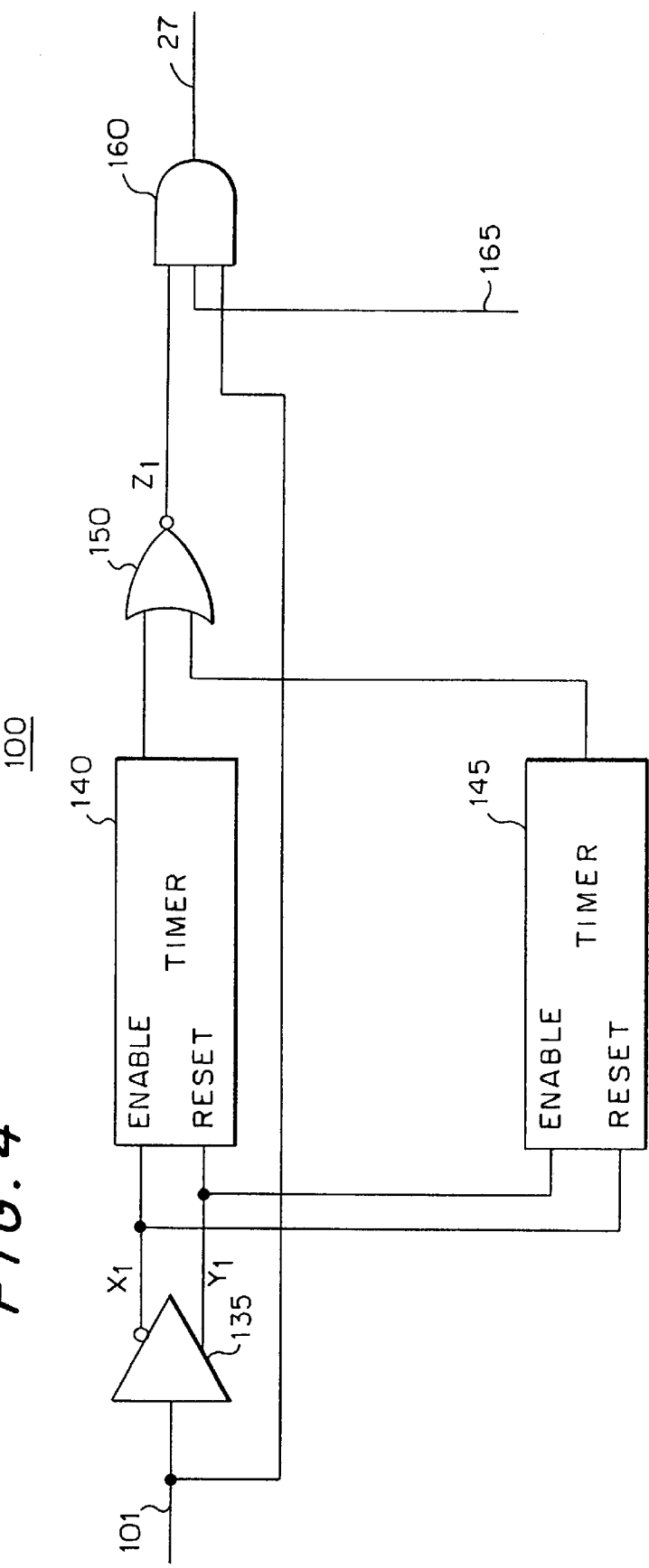
FIG. 4 is a logic diagram of the embodiment of FIG. 3.

FIG. 4 is a logic level diagram of the leakage limiting circuit 100. FIG. 4 illustrates the leakage limiting circuit 100 from a functional point of view. The input shift signal 101 is input into a buffer 135. The outputs of the buffer 135 are signals X1 and Y1. The signal X1 is the inverse of the input shift signal 101, and the signal Y1 is the same as the input shift signal 101. The signal X1 enables a timer 140. That is, the timer 140 starts counting time ("ticking") when the signal X1 transitions from low to high. The timer 140 continues to tick for a predetermined amount of time, unless the signal Y1 goes high, causing the timer 140 to reset. The predetermined amount of time is dependent on a value of a particular process parameter being monitored (not shown). Thus, unless the signal Y1 resets the timer 140, the timer 140 delays the rising edge of the signal X1 by the predetermined amount of time. Similarly, the signals X1 and Y1 are input to a second timer 145, as shown. The output signals from the timers 140 and 145 are input to a NOR gate 150. An output signal Z1 from the NOR gate 150 is input to an AND gate 160. In addition, the shift input signal 101 and an enable signal 165 are input to the AND gate 160, whose output is the shift signal 27. The shift signal 27 is used by other circuits, such as a dynamic latch, near the leakage limiting circuit 100. The other circuits are sensitive to one or more of the process parameters being monitored by the leakage limiting circuit 100.

One skilled in the art will readily recognize that many different logic circuits can be designed to perform as the logic shown in FIG. 4. For example, well known gate transformation result in different but logically equivalent circuits.

Figure 5:
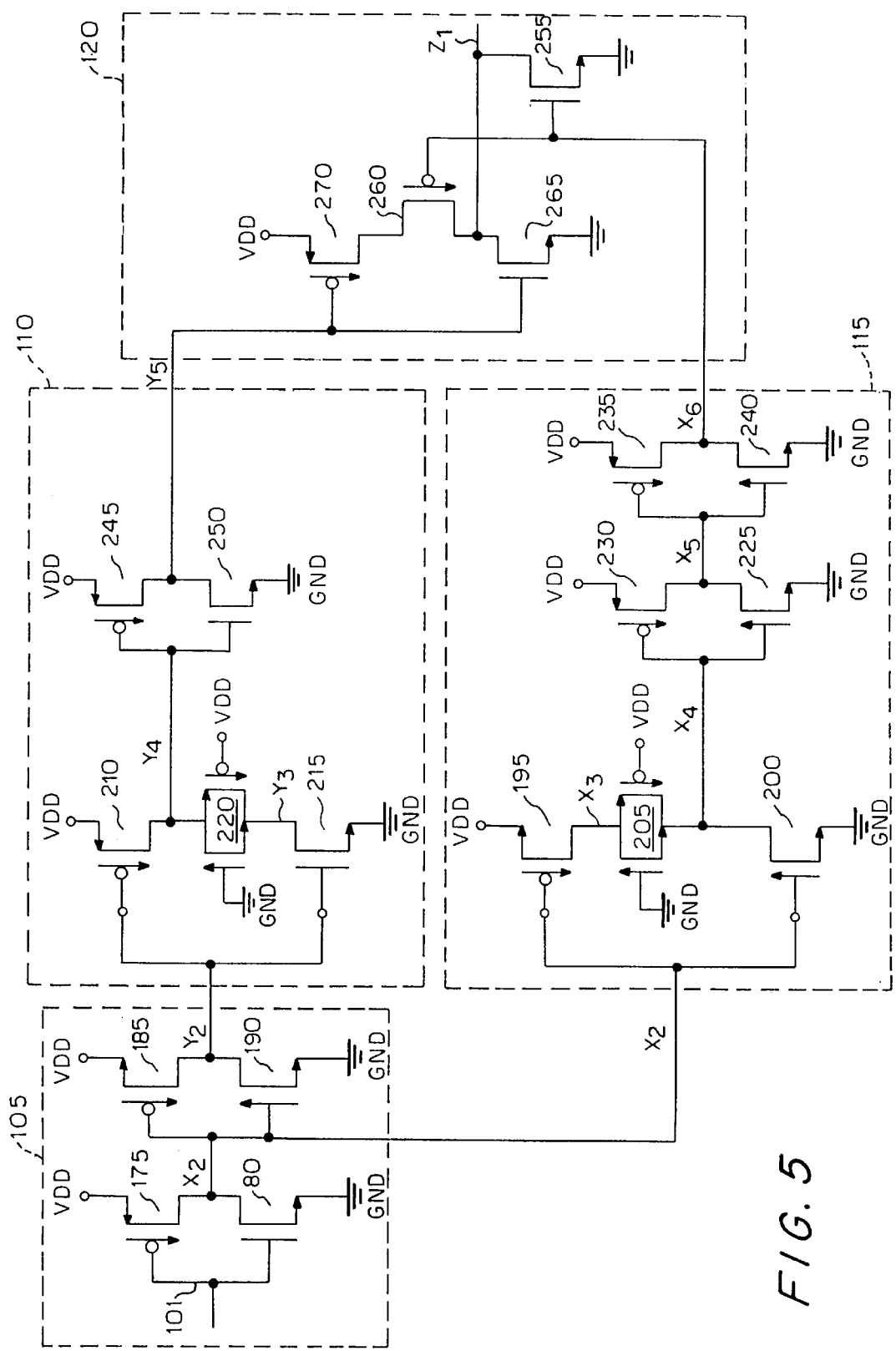
FIGS. 5 and 6 are schematic diagrams of the embodiment of FIG. 3.
Figure 6:
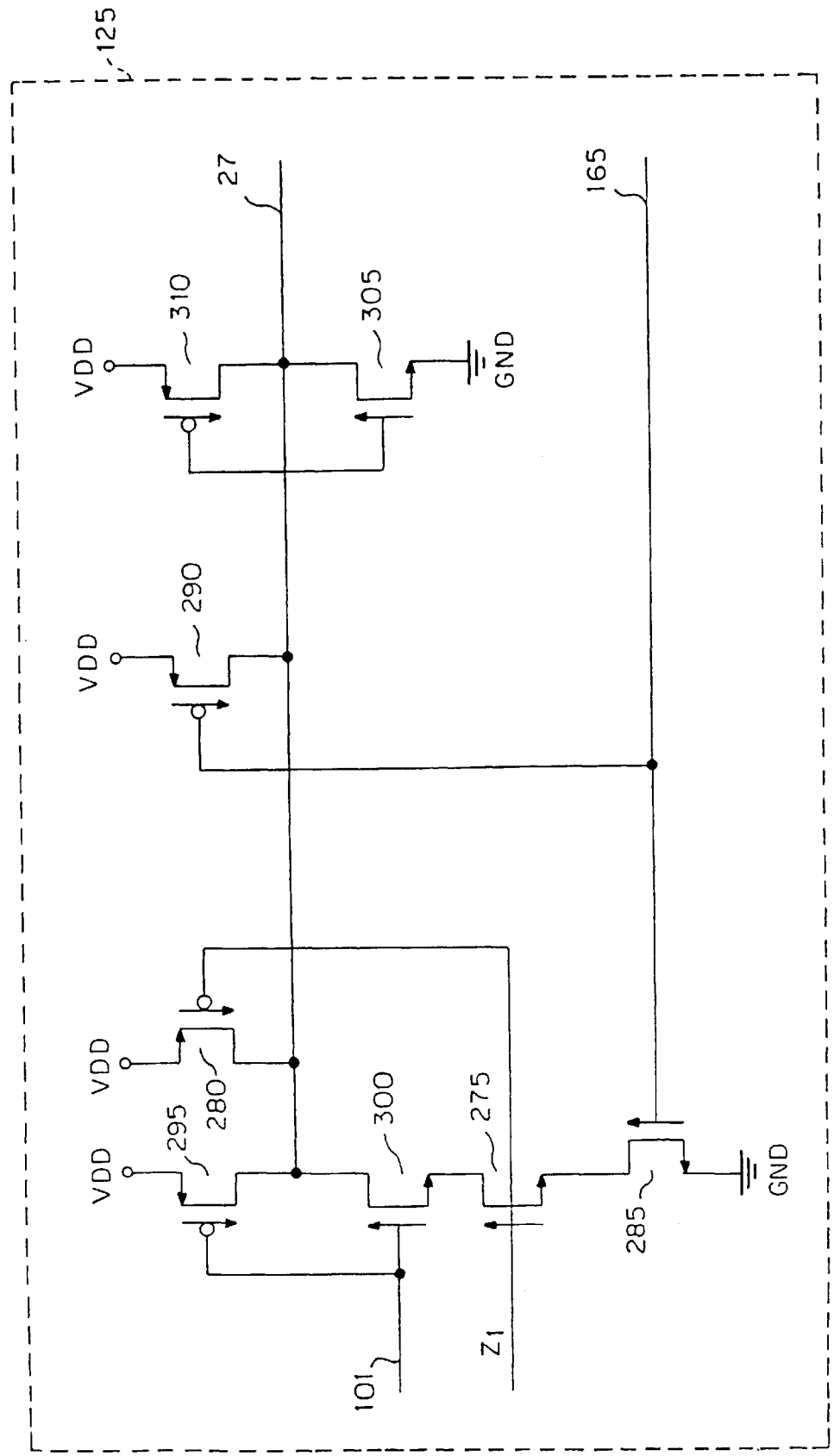

FIGS. 5 and 6 are schematic diagrams of the leakage limiting circuit 100 at the transistor level for use in tracking FET leakage. The input shift signal 101 is connected to the gate terminals of a PFET 175 and an NFET 180 connected in a well-known inverter configuration having an output signal X2. When the input shift signal 101 is high, the PFET 175 is an open circuit between its source and drain terminals (i.e., "turned off"), while the NFET 180 conducts from its source to drain (i.e., "turns on"). Thus, when the input shift signal 101 is high, the signal X2 is low by virtue of its connection to ground via the NPET 180. Likewise, when the input shift signal 101 is low, the signal X2 is high as the PFET 175 is turned on and the NEET 180 is turned off. The signal X2 is input to a PFET 185 and an NFET 190, both of which are together configured as an inverter having an output signal Y2. Thus, the signal Y2 is the logical inverse of the signal X2, and thus the same as the input shift signal 101 ( except for switching delays).

The signal Y2 is the input signal for the NFET leakage monitor 110. In particular, the signal Y2 is input to the gate terminals of a PFET 210 and an NFET 215. The PFET 210 and the NFET 215 are configured like an inverter except for an NFET-PFET pair 220 (often called a "pass gate") connected between the PFET 210 and the NFET 215. When the signal Y2 is high, the NFET 215 is turned on and a node Y3 is pulled low. The low voltage at the node Y3 and the high voltage at a node Y4 place the pass gate 220 in a condition where subthreshold leakage occurs from the node Y4 to the node Y3. The transistors of the pass gate 220 have substantially greater width than those of the typical pass gates in the protected circuit. Because the amount of subthreshold leakage is proportional to the width of the transistor, the pass gate 220 will exhibit subthreshold leakage at an accelerated rate. Over time, the subthreshold leakage drains charge from the node Y4 into the node Y3 until the node Y4 is forced low like the node Y3. The logic level at the node Y4 is inverted by the arrangement of a PFET 245 and an NFET 250, producing an output signal YX. Thus, the output signal Y5 transitions from low to high some time after the signal Y2 transitions from low to high. The amount of time necessary for this to happen is based on the width of the transistors of the pass gate 220 and the subthreshold leakage value. When the input shift signal 101, and thus the signal Y2, transitions from high to low, the PFET 210 turns on, forcing the signal Y4 high and thus the signal Y5 low, regardless of any subthreshold leakage. Overall, the signal Y5 is low except when the shift input signal 101 pulses high for too long a time, after which the signal Y5 pulses high until the shift input signal 101 pulse ends.

The PFET leakage monitor 115 is similar to the NFET leakage monitor 110. The input to the PFET leakage monitor 115 is the complement of the input to the NFET leakage monitor 110. Accordingly, the PFET leakage monitor 115 includes an additional inverter on its output. The signal X2 is the input signal for the PFET leakage monitor 115. In particular, the signal X2 is input to the gate terminals of a PFET 195 and an NFET 200. The PFET 195 and the NFET 200 are configured like an inverter except for an NFET-PFET pair (or pass gate) 205 connected between the PFET 195 and the NFET 200. When the signal X2 is low, the PFET 195 is turned on and a node X3 is pulled high. The high voltage at the node X3 places the pass gate 205 in a condition where subthreshold leakage occurs from the node X3 to a node X4. The transistors of the pass gate 205 have substantially greater width than a typical FET. Because the amount of subthreshold leakage is proportional to the width of the transistor, the pass gate 205 exhibits subthreshold leakage at an accelerated rate. Over time, the subthreshold leakage trickles charge onto the node X4 until the node X4 is forced high like the node X3. The logic level at the node X4 is inverted first by the arrangement of a PFET 230 and an NFET 225, and again by the arrangement of a PFET 235 and an NFET 240, producing an output signal X6. Thus, X6 transitions from low to high some time after the signal X2 transitions from high to low. The amount of time necessary for this to happen is based on the width of the transistors of the pass gate 205 and the subthreshold leakage of the transistors. When the input shift signal 101 transitions from high to low and the signal X2 transitions from low to high, the NFET 200 turns on, forcing the signals X4 and X6 high, regardless of any subthreshold leakage. Overall, the signal X6 is low except when the shift input signal 101 pulses high for too long a time, after which the signal X6 pulses high until the shift input signal 101 pulse ends.

The pass gates 205 and 220 are similar, but they monitor leakage in different ways. In particular, the pass gate 220 monitors a stored high voltage (at the node Y4) leaking to a low voltage, whereas the pass gate 205 monitors a stored low voltage (at the node X4) leaking to a high voltage. Because leakage across an NFET is the primary mechanism for leaking charge from a high voltage to a low voltage, the pass gate 220 is part of the NFET leakage monitor 110. Likewise, because leakage across a PFET is the primary mechanism for leaking charge from a low voltage to a high voltage, the pass gate 205 is part of the PFET leakage monitor 115.

The signals Y5 and X6, output from the NFET leakage monitor 110 and the PFET leakage monitor 115, respectively, are input to an arrangement of NFETs 255 and 265 as well as PFETs 260 and 270, which form a NOR gate 120 and produce the signal Z1 as its output. In this way, Z1 is low if either the signal Y5 or the signal X6 is high. The signal Z1 is input to an NFET 275 and a PFET 280, which are part of an AND gate 125, as shown in FIG. 6. Also input to the AND gate 125 are the shift input signal 101, which is connected to an NFET 300 and a PFET 295, and the enable signal 165, which is connected to an NFET 285 and a PFET 290. An NFET 305 and a PFET 310 complete the AND gate 125, whose output is the shift signal 27. The shift signal 27 is high if all of the signal Z1, the shift input signal 101 and the enable single 165 are high. That is, when enabled, pulses on the shift signal 27 are possibly truncated versions of pulses on the input shift signal 101. Truncation results when either NFET leakage or PFET leakage, whichever is first, occurs to the necessary extent.

In summary, the leakage limiting circuit 100 protects circuits that use the shift signal 27 from failure. In particular, the leakage limiting circuit 100 protects from failures produced by subthreshold leakage. For example, the protected circuit is one, like the shift register circuit 10, containing a dynamic latch. For best protection, the protected circuit and the leakage limiting circuit 100 should be located physically near to one another and constructed using the same or similar manufacturing processes, so that the correlation between the protected circuit and the leakage limiting circuit 100 is high. For example, the FETs forming the pass gates 220 and 205 are ideally very similar to the FETs forming the pass gates 15, except for their widths. Preferably, the leakage limiting circuit 100 and the protected circuit are on the same integrated circuit so that manufacturing process variations are minimized.

The terms and descriptions used herein are set forth by way of illustration only and are not meant as limitations. For example, one skilled in the art will readily recognize that the FETs illustrated in FIGS. 5 and 6 are exemplary of switching devices generally and that other switching devices may be utilized in their places to accomplish the same or similar functions. Those skilled in the art will recognize that these and many other variations are possible within the spirit and scope of the invention as defined in the following claims, and their equivalents, in which all terms are to be understood in their broadest sense unless otherwise indicated.

What is claimed is:

1. A circuit for processing a pulse for use with a second circuit, the circuit comprising:
    a timer, wherein the timer produces an output in a given state if the duration of the pulse reaches a predetermined amount of time, wherein the predetermined amount of time is related to a parameter of the second circuit; and
    one or more logic gates, the one or more logic gates having an output that is the same as the pulse unless and until the output of the timer is in the given state, at which time, the output of the one or more logic gates is forced to a non-pulsed state.

2. The circuit of claim 1 wherein the parameter is a leakage rate.

3. The circuit of claim 2 wherein the leakage rate is a subthreshold leakage rate across a switching device.

4. The circuit of claim 2 wherein the switching device is a FET.

5. The circuit of claim 1 further comprising:
    a second timer, wherein the second timer produces a second output in a given state if the duration of the pulse reaches a second predetermined amount of time, wherein the second predetermined amount of time is related to a second parameter of the second circuit.

6. The circuit of claim 5 wherein the one or more logic gates comprise:
    a NOR gate having inputs accepting the output of the timer and second output of the second timer.

7. The circuit of claim 5 wherein the one or more logic gates comprise:
    a AND gate having an input connected to the output of the NOR gate and an input accepting the pulse.

8. The circuit of claim 7 wherein the AND gate further comprises an input connected to an enable signal.

9. The circuit of claim 1 wherein the timer comprises:
    an NFET and a PFET, wherein the gate terminal of the NFET is connected to ground, the gate terminal of the PFET is connected to a positive supply voltage, the source terminal of the NFET is connected to the drain terminal of the PFET, and the drain terminal of the NFET is connected to the source terminal of the PFET.

10. The circuit of claim 9 wherein a width of the NFET and the PFET are considerably greater than normal.

11. The circuit of claim 1 wherein the second circuit comprises a dynamic latch.

12. The circuit of claim 1 wherein the circuit and the second circuit are packaged together in an integrated circuit.

13. A method for use with a circuit in which leakage can occur at a first rate, the method comprising:
    sensing a condition that prompts leakage to occur in the circuit;
    producing, in response to the sensing step, a related leakage at a faster rate than the first rate; and
    disabling the condition if the related leakage reaches a predetermined level.

14. The method of claim 13 wherein the leakage is subthreshold leakage across an FET.

15. The method of claim 13 wherein the condition is a pulse.

16. The method of claim 15 wherein the sensing step comprises:
    buffering the pulse.

17. The method of claim 15 wherein the disabling step comprises:
    terminating the pulse.

18. A circuit in which leakage can occur at a first rate, the circuit comprising:
    a means for sensing a condition that prompts leakage to occur in the circuit;
    a means for producing, in response to the sensing step, a related leakage at a faster rate than the first rate; and
    a means for disabling the condition if the related leakage reaches a predetermined level.

19. The circuit of claim 18 wherein the leakage is a subthreshold leakage across an FET.

20. The circuit of claim 18 wherein the condition is a pulse.

* * * * *